(12) United States Patent
Ikenaga et al.

(10) Patent No.: US 9,806,241 B2
(45) Date of Patent: Oct. 31, 2017

(54) RESIN-ATTACHED LEAD FRAME AND SEMICONDUCTOR DEVICE

(71) Applicant: DAI NIPPON PRINTING CO., LTD., Tokyo-to (JP)

(72) Inventors: Chikao Ikenaga, Kitamoto (JP); Kazunori Oda, Kawaguchi (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 15/246,608

(22) Filed: Aug. 25, 2016

(65) Prior Publication Data

US 2016/0365495 A1    Dec. 15, 2016

Related U.S. Application Data

(63) Continuation of application No. 13/980,980, filed as application No. PCT/JP2012/051432 on Jan. 24, 2012, now Pat. No. 9,461,220.

(30) Foreign Application Priority Data

Jan. 27, 2011    (JP) .................................. 2011-015274

(51) Int. Cl.
*H01L 33/56*        (2010.01)
*H01L 33/48*        (2010.01)
(Continued)

(52) U.S. Cl.
CPC .............. *H01L 33/56* (2013.01); *H01L 33/46* (2013.01); *H01L 33/486* (2013.01); *H01L 33/60* (2013.01);
(Continued)

(58) Field of Classification Search
CPC ......... H01L 33/56; H01L 33/46; H01L 33/62; H01L 33/60; H01L 33/486;
(Continued)

(56) References Cited

U.S. PATENT DOCUMENTS 4,951,119 A    8/1990  Yonemochi et al.
6,355,946 B1   3/2002  Ishinaga
(Continued)

FOREIGN PATENT DOCUMENTS

EP    2 325 901 A1    5/2011
JP    2004165567 A    6/2004
(Continued)

OTHER PUBLICATIONS

May 29, 2015 Office Action issued in Chinese Patent Application No. 201280005657.6.
(Continued)

*Primary Examiner* — Latanya N Crawford
(74) *Attorney, Agent, or Firm* — Oliff PLC

(57) ABSTRACT

A resin-attached lead frame and a semiconductor device including the resin-attached lead frame. The resin-attached lead frame includes a lead frame main body having a die pad (LED element resting portion) and a lead portion disposed apart from the die pad. The lead frame main body further includes an LED element resting region formed over an area including an upper surface of the die pad and an upper surface of the lead portion. A reflecting resin section surrounds the LED element resting region of the lead frame main body. A vapor-deposited aluminum layer or a sputtered aluminum layer is provided on an upper surface of the LED element resting region of the lead frame main body.

8 Claims, 15 Drawing Sheets

(51) Int. Cl.
*H01L 33/60* (2010.01)
*H01L 33/62* (2010.01)
*H01L 33/46* (2010.01)
*H01L 23/498* (2006.01)

(52) U.S. Cl.
CPC ........ *H01L 33/62* (2013.01); *H01L 23/49861* (2013.01); *H01L 2224/48091* (2013.01); *H01L 2224/48247* (2013.01)

(58) Field of Classification Search
CPC ..... H01L 23/49861; H01L 2224/48091; H01L 2224/48247
See application file for complete search history.

(56) References Cited

U.S. PATENT DOCUMENTS

| | | |
|---|---|---|
| 8,378,369 B2 | 2/2013 | Hanawa et al. |
| 8,530,250 B2 | 9/2013 | Ichikawa et al. |
| 2006/0255357 A1 | 11/2006 | Hata et al. |
| 2008/0054288 A1 | 3/2008 | Harrah et al. |
| 2008/0185605 A1 | 8/2008 | Wada et al. |
| 2008/0296604 A1 | 12/2008 | Chou et al. |
| 2009/0141498 A1 | 6/2009 | Kawanobe et al. |
| 2010/0078669 A1 | 4/2010 | Cho et al. |
| 2010/0133565 A1 | 6/2010 | Cho et al. |
| 2010/0193816 A1 | 8/2010 | Liu |
| 2010/0252848 A1 | 10/2010 | Liang et al. |
| 2010/0321941 A1 | 12/2010 | Sakai et al. |
| 2011/0210354 A1 | 9/2011 | Ichikawa et al. |
| 2012/0044667 A1 | 2/2012 | Hanawa et al. |
| 2012/0074451 A1* | 3/2012 | Lin .................. H01L 33/62 257/99 |
| 2012/0211785 A1 | 8/2012 | Ng et al. |
| 2012/0228660 A1* | 9/2012 | Lee .................. H01L 33/60 257/98 |
| 2013/0009190 A1 | 1/2013 | Memida |
| 2013/0221509 A1 | 8/2013 | Oda et al. |

FOREIGN PATENT DOCUMENTS

| | | |
|---|---|---|
| JP | 2005019688 A | 1/2005 |
| JP | 2005136379 A | 5/2005 |
| JP | 2006156747 A | 6/2006 |
| JP | 2007294631 A | 11/2007 |
| JP | 2008172125 A | 7/2008 |
| JP | 2010-062272 A | 3/2010 |
| JP | 2011003853 A | 1/2011 |
| TW | I245437 B | 12/2005 |
| WO | 2010/026716 A1 | 3/2010 |
| WO | 2010/029872 A1 | 3/2010 |

OTHER PUBLICATIONS

Aug. 6, 2015 Office Action issued in Taiwanese Patent Application No. 101102701.
Sep. 4, 2015 Office Action issued in Japanese Application No. 2012-554800.
Feb. 2, 2016 Office Action Issued in U.S. Appl. No. 13/980,980.
Apr. 17, 2012 International Search Report issued in International Application No. PCT/JP2012/051432 (with translation).
Jul. 30, 2013 International Preliminary Report on Patentability issued in International Application No. PCT/JP2012/051432 (with translation).
Nov. 28, 2014 Office Action Issued in U.S. Appl. No. 13/980,980.
Jul. 20, 2015 Office Action Issued in U.S. Appl. No. 13/980,980.
Dec. 2, 2016 Office Action issued in Korean Application No. 10-2013-7016578.

* cited by examiner

RESIN-ATTACHED LEAD FRAME AND SEMICONDUCTOR DEVICE

This is a Continuation of Application Ser. No. 13/980,980 filed Jul. 22, 2013, which in turn is a national phase application of PCT/JP2012/051432 filed Jan. 24, 2012, which claims the benefit of priority of JP 2011-015274 filed Jan. 27, 2011. The disclosure of the prior applications is hereby incorporated by reference herein in its entirety

TECHNICAL FIELD

The present invention relates to a resin-attached lead frame used for resting LED elements thereupon, to a method for manufacturing the lead frame, and to a lead frame.

BACKGROUND

In recent years, optical devices, especially LED devices, are expanding their applications as illumination for cellular phones, or as backlights for liquid crystals. These applications are expanding to the general lighting or illumination recently replacing incandescent light bulbs. In general, however, the light-emission efficiency of LED devices in one wafer has a tendency to vary significantly. In addition, these LED devices are still too low in light-emission efficiency to find their use in general lighting/illumination applications, and thus a plurality of LED elements need to be mounted in one LED device.

Among the packaging techniques for these LED devices are one in which LED elements are mounted on an organic substrate of a glass epoxy or the like and after wire bonding, the LED elements are sealed with an epoxy-based transparent resin and then separated into individual pieces using a method called singulation. In another packaging technique, a reflecting plate formed from a white resin such as polyphthalamide (PPA) is molded as a reflecting resin portion on a ceramic substrate, then after LED elements have been mounted on the reflecting plate and wire-bonded, the LED elements are sealed with an epoxy-based transparent resin and separated into individual pieces by singulation. In yet another technique, a reflecting plate is molded with a white resin, such as PPA, on a lead frame, then after LED elements have been mounted on the reflecting plate and wire-bonded, the LED elements are sealed with a transparent resin and separated into individual pieces by singulation.

PRIOR ART LITERATURE

Patent Documents

Patent Document 1: JP-A-2005-136379

As outlined above, for improved light-extraction efficiency (luminous flux) of an LED package, a premolding of a reflecting plate formed from a synthetic resin is used as a substrate on which LED elements are to be mounted. Traditionally, lead frames having a totally silver-plated surface to enhance their light-reflection efficiency are also used. Depending upon the type of synthetic resin constituting the reflecting plate, however, the ultraviolet rays emitted from the LED elements may cause yellowish discoloration due to deterioration, thus resulting in light extraction efficiency decreasing over time. Additionally, the silver plating of the lead frame causes a reaction with the hydrogen sulfide contained in air, and leads to brownish discoloration.

The present invention has been made with the above taken into consideration, and an object of the invention is to provide a resin-attached lead frame, its manufacturing method, and lead frame adapted to enhance extraction efficiency of light emissions from LED elements included in a semiconductor device, and to prevent the lead frame from degrading with time.

SUMMARY OF THE INVENTION

A first aspect of the present invention is a resin-attached lead frame, comprising: a lead frame main body including a plurality of LED element resting portions and a plurality of lead portions each spaced from the corresponding one of the LED element resting portions, the lead frame main body further including LED element resting regions each formed over an area including an upper surface of each of the LED element resting portions and an upper surface of each of the lead portions; and a reflecting resin section surrounding each of the LED element resting regions of the lead frame main body; wherein a vapor-deposited aluminum layer or a sputtered aluminum layer is provided on respective upper surfaces of the LED element resting regions of the lead frame main body.

A second aspect of the present invention is a resin-attached lead frame, comprising: a lead frame main body including an LED element resting portion and a lead portion disposed apart from the LED element resting portion, the lead frame main body further including an LED element resting region formed over an area including an upper surface of the LED element resting portion and an upper surface of the lead portion; and a reflecting resin section surrounding the LED element resting region of the lead frame main body; wherein a vapor-deposited aluminum layer or a sputtered aluminum layer is provided on an upper surface of the LED element resting region of the lead frame main body.

In the resin-attached lead frame according to either of the first and second aspects of the present invention, the vapor-deposited aluminum layer or the sputtered aluminum layer is further provided on an inner wall of the reflecting resin section as well In the resin-attached lead frame according to the first aspect of the present invention, the plurality of LED element resting regions of the lead frame main body are arranged lengthwise and breadthwise.

The lead frame main body of the resin-attached lead frame according to either of the first and second aspects of the present invention is formed from any one of copper, a copper alloy, and a 42-alloy; wherein, of the lead frame main body, at least the upper surface of the LED element resting region is worked into a mirror-like finish having a roughness level of 0.01 µm to 0.10 µm in arithmetic average height "Sa" and 2 µm to 18 µm in roughness curvilinear element average length "Sm".

In the resin-attached lead frame according to either of the first and second aspects of the present invention, a silver-plated layer is provided on a lower surface of the lead portion as well as on a lower surface of the LED element resting portion of the lead frame main body.

In the resin-attached lead frame according to either of the first and second aspects of the present invention, grooves for enhancing adhesion between the lead frame main body and the reflecting resin section are formed on an upper surface of the lead frame main body.

In the resin-attached lead frame according to either of the first and second aspects of the present invention, a reflecting metallic layer is provided on an upper surface of the reflecting resin section.

In the resin-attached lead frame according to either of the first and second aspects of the present invention, the upper surface of the reflecting resin section has a part which is cut by dicing, the reflecting resin section is exposed at the part.

In the resin-attached lead frame according to either of the first and second aspects of the present invention, an inward concaved recess is formed on the upper surface of the reflecting resin section.

A third aspect of the present invention is a lead frame comprising: a lead frame main body including a plurality of LED element resting portions and a plurality of lead portions each spaced from the corresponding one of the LED element resting portions, the lead frame main body further including LED element resting regions each formed over an area including an upper surface of each of the LED element resting portions and an upper surface of each of the lead portions; wherein a vapor-deposited aluminum layer or a sputtered aluminum layer is provided on respective upper surfaces of the LED element resting regions of the lead frame main body.

A fourth aspect of the present invention is a lead frame comprising: a lead frame main body including an LED element resting portion and a lead portion disposed apart from the LED element resting portion, the lead frame main body further including an LED element resting region formed over an area including an upper surface of the LED element resting portion and an upper surface of the lead portion; wherein a vapor-deposited aluminum layer or a sputtered aluminum layer is provided on an upper surface of the LED element resting region of the lead frame main body.

A fifth aspect of the present invention is a method for manufacturing a resin-attached lead frame, the method comprising the steps of: providing a lead frame main body including a plurality of LED element resting portions and a plurality of lead portions each spaced from the corresponding one of the LED element resting portions, the lead frame main body further including LED element resting regions each formed over an area including an upper surface of each of the LED element resting portions and an upper surface of each of the lead portions; providing a vapor-deposited aluminum layer or an sputtered aluminum layer on respective upper surfaces of the LED element resting regions of the lead frame main body; and providing a reflecting resin section surrounding each of the LED element resting regions of the lead frame main body.

A sixth aspect of the present invention is a method for manufacturing a resin-attached lead frame, the method comprising the steps of: providing a lead frame main body including a plurality of LED element resting portions and a plurality of lead portions each spaced from the corresponding one of the LED element resting portions, the lead frame main body further including LED element resting regions each formed over an area including an upper surface of each of the LED element resting portions and an upper surface of each of the lead portions; providing a reflecting resin section surrounding each of the LED element resting regions of the lead frame main body; and providing a vapor-deposited aluminum layer or a sputtered aluminum layer on an inner wall of the reflecting resin section as well as on respective upper surfaces of the LED element resting regions of the lead frame main body.

In accordance with the present invention, the vapor-deposited aluminum layer or the sputtered aluminum layer is provided on the upper surfaces of each LED element resting region of the lead frame main body. This achieves efficient reflection of light from LED elements and enhances extraction efficiency of the light from each LED device, while at the same time preventing the lead frame from degrading with time.

MODE FOR CARRYING OUT THE INVENTION

First Embodiment

Hereunder, a first embodiment of the present invention will be described referring to FIGS. 1 to 10.

Lead Frame Configuration

Figure 1:
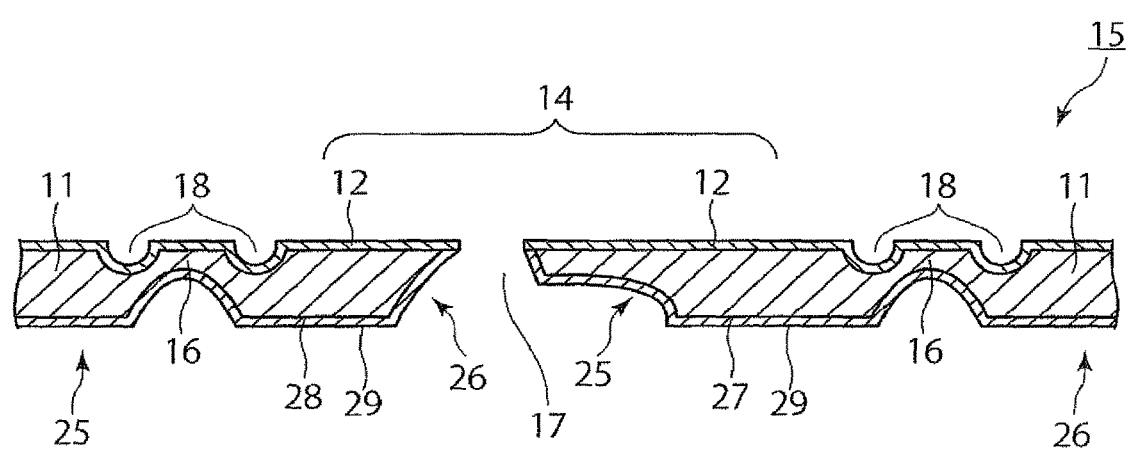
FIG. 1 is a sectional view of a lead frame according to a first embodiment of the present invention, the sectional view being taken along line I-I in FIG. 2.
Figure 2:
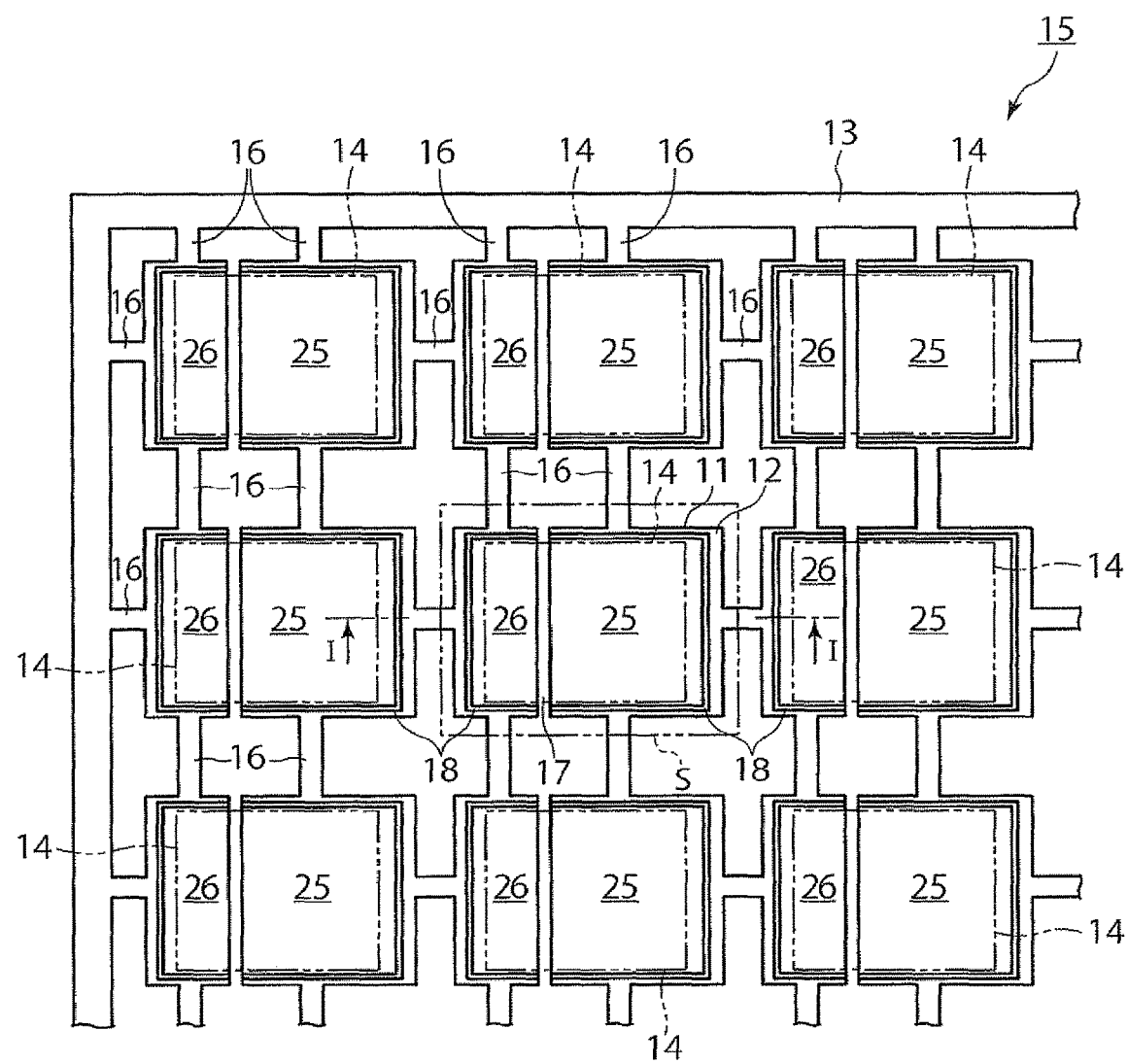
FIG. 2 is a plan view showing the lead frame according to the first embodiment of the present invention.

First, a lead frame for resting LED elements, according to the present embodiment is outlined below per FIGS. 1 and 2. FIGS. 1 and 2 are a cross-sectional view, and a plan view, respectively, of the lead frame according to the present embodiment.

The lead frame 15 shown in FIGS. 1 and 2 includes a lead frame main body 11 having a plurality of LED element resting regions 14, and metallic layers 12 provided on upper surfaces of the LED element resting regions 14 of the lead frame main body 11, the metallic layers 12 each functioning as a reflecting layer for reflecting light emitted from an LED element 21.

The lead frame main body (hereinafter referred to simply as the lead frame body) 11 is formed from a sheet of metal. The metal sheet constituting the lead frame body 11 can be of a material such as copper, copper alloy, or 42-alloy (a Fe alloy with a 42% Ni content). Thickness of the lead frame body 11 depends on a configuration of a semiconductor device. Preferable thickness, however, ranges between 0.1 mm and 0.5 mm, inclusive.

In addition, as shown in FIG. 2, the lead frame body 11 has an outer frame 13, and the plurality of LED element resting regions 14 are arranged lengthwise and breadthwise inside the outer frame 13. The lead frame body 11 further includes a plurality of die pads (LED element resting portions) 25 and a plurality of lead portions 26 each spaced from one of the die pads 25, and each LED element resting region 14 is formed over upper surfaces of one die pad 25 and one lead portion 26. A space 17 to be filled in with the reflecting resin section 23 is formed between the die pad 25 and the lead portion 26. The die pad 25 and the lead portion 26 are coupled to another adjacent die pad 25 and another adjacent lead portion 26, respectively, or to the outer frame 13, via an independent, rod-shaped tie bar 16.

As shown in FIG. 1, a first outer lead portion 27 is formed on a lower surface of the die pad 25, and a second outer lead portion 28 is formed on a lower surface of the lead section 26. On each of the first outer lead portion 27 and the second outer lead portion 28, a silver-plated layer 29 is provided to enhance a degree of contact with solder. The plated layer 29 is preferably 2 µm to 10 µm thick.

Each metallic layer 12 may be formed by, for example, vapor deposition or sputtering, and examples of a material constituting the metallic layer can be aluminum, silver, rhodium, palladium, platinum, copper, and the like. An example in which the metallic layer 12 is formed from a vapor-deposited aluminum layer or a sputtered aluminum layer is described below (hereinafter, this metallic layer is also referred to simply as the vapor-deposited aluminum layer or sputtered aluminum layer 12). The vapor-deposited aluminum layer or sputtered aluminum layer 12, functioning as a layer for reflecting the light from the LED element 21, is positioned on the uppermost surface side of the lead frame 15. The vapor-deposited aluminum layer or sputtered aluminum layer 12 is formed by vacuum-vapor-depositing aluminum or sputtering aluminum. The vapor-deposited aluminum layer or sputtered aluminum layer 12 is formed to have an extremely small thickness. More specifically, the thickness preferably ranges between 0.1 µm and 1.0 µm, inclusive. The vapor-deposited aluminum layer or sputtered aluminum layer 12 may be formed directly on the lead frame body 11, but may be formed thereupon via a bonding layer formed from, for example, a layer plated with silver (Ag).

In addition, although the vapor-deposited aluminum layer or sputtered aluminum layer 12 in the present embodiment is provided on an entire upper surface of the lead frame body 11 that includes the outer frame 13 and the tie bars 16, the vapor-deposited aluminum layer or sputtered aluminum layer 12 needs only to be formed at least in the LED element resting regions 14 on the upper surface of the lead frame body 11. This is because the LED element resting regions 14, not shrouded by the reflecting resin section 23 (described later herein) of the lead frame body 11, are sections that contribute to reflecting the light from each LED element 21.

Figure 21:
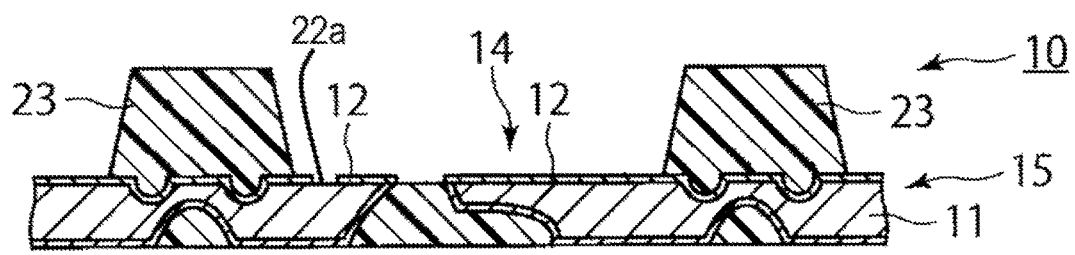
FIG. 21 is a sectional view showing a modification of the resin-attached lead frame according to the first embodiment of the present invention in which the vapor-deposited or sputtered aluminum layer is absent on a section of the lead frame body surface that is subjected to wire bonding.

In another example, as shown in FIG. 21, the vapor-deposited aluminum layer or sputtered aluminum layer 12 may be absent on a section 22a of the lead frame body surface that is subjected to wire bonding.

Figure 22:
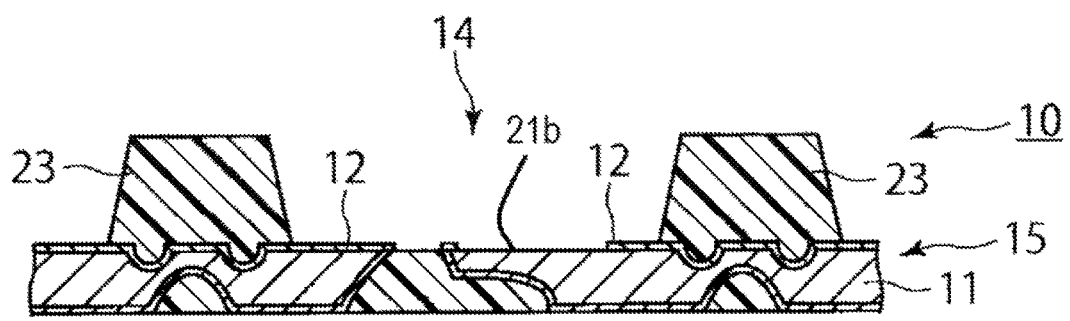
FIG. 22 is a sectional view showing a modification of the resin-attached lead frame according to the first embodiment of the present invention in which the vapor-deposited or sputtered aluminum layer is absent on a section of the lead frame body surface that is subjected to the mounting of an LED element.

In yet another example, as shown in FIG. 22, the vapor-deposited aluminum layer or sputtered aluminum layer 12 may be absent on a section 21b of the lead frame body surface that is subjected to the mounting of an LED element 21.

In a further example, while the vapor-deposited aluminum layer or sputtered aluminum layer 12 may be provided on the upper surface of the lead frame body 11 via a bonding layer (not shown) formed from a silver-plated layer, the vapor-deposited aluminum layer or sputtered aluminum layer 12 may not be provided on a section 22a of the lead frame body surface that is subjected to wire bonding.

In a further example, while the vapor-deposited aluminum layer or sputtered aluminum layer 12 may be provided on the upper surface of the lead frame body 11 via a bonding layer (not shown) formed from a silver-plated layer, the vapor-deposited aluminum layer or sputtered aluminum layer 12 may not be provided on a section 21b of the lead frame body surface that is subjected to the mounting of an LED element 21.

In a further example, of the lead frame body 11, at least upper surfaces of each LED element resting region 14 are preferably preworked into a mirror-like finish before the vapor-deposited aluminum layer or sputtered aluminum layer 12 is provided on the upper surfaces. Preferable surface roughness of the LED element resting region 14 in this case is such that surface roughness of the LED element resting region 14 as measured using the Optical Surface & Layer Profiling System VertScan 2.0 (manufacturer: Ryoka Systems Inc.) will range between 0.01 µm and 0.10 µm, inclusive, in arithmetic average height "Sa" and between 2 µm and 18 µm, inclusive, in roughness curvilinear element average length "Sm". This will increase a reflectance of the vapor-deposited aluminum layer or sputtered aluminum layer 12 formed on the upper surface of the LED element resting region 14, and thereby achieve more efficient reflection of the light from the LED element 21.

Furthermore, grooves 18 for enhancing adhesion between the lead frame body 11 and the reflecting resin section 23 are formed on the upper surface of the lead frame body 11. The grooves 18, each having a rectangular shape in a plane view (except at the space 17), are provided along an outer edge of the LED element resting region 14 on the upper surface of the lead frame body 11.

Reference symbol S (double-dotted chain line) in FIG. 2 denotes a region of the lead frame 15 that corresponds to the semiconductor device 20 (see FIGS. 5 and 6) detailed later herein.

While in the present embodiment the lead frame body 11 includes a plurality of die pads 25 and a plurality of lead portions 26 spaced from one of the die pads 25, the lead frame body 11 is not limited to this configuration and needs only to include at least one die pad 25 and one lead portion 26.

Resin-Attached Leaf Frame Configuration

Figure 3:
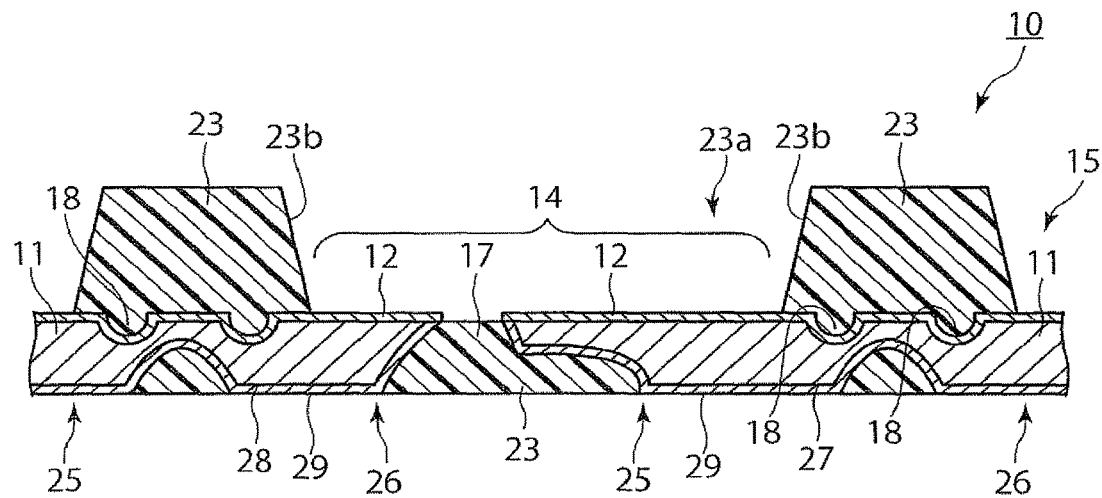
FIG. 3 is a sectional view of the resin-attached lead frame according to the first embodiment of the present invention, the sectional view being taken along line III-III in FIG. 4.
Figure 4:
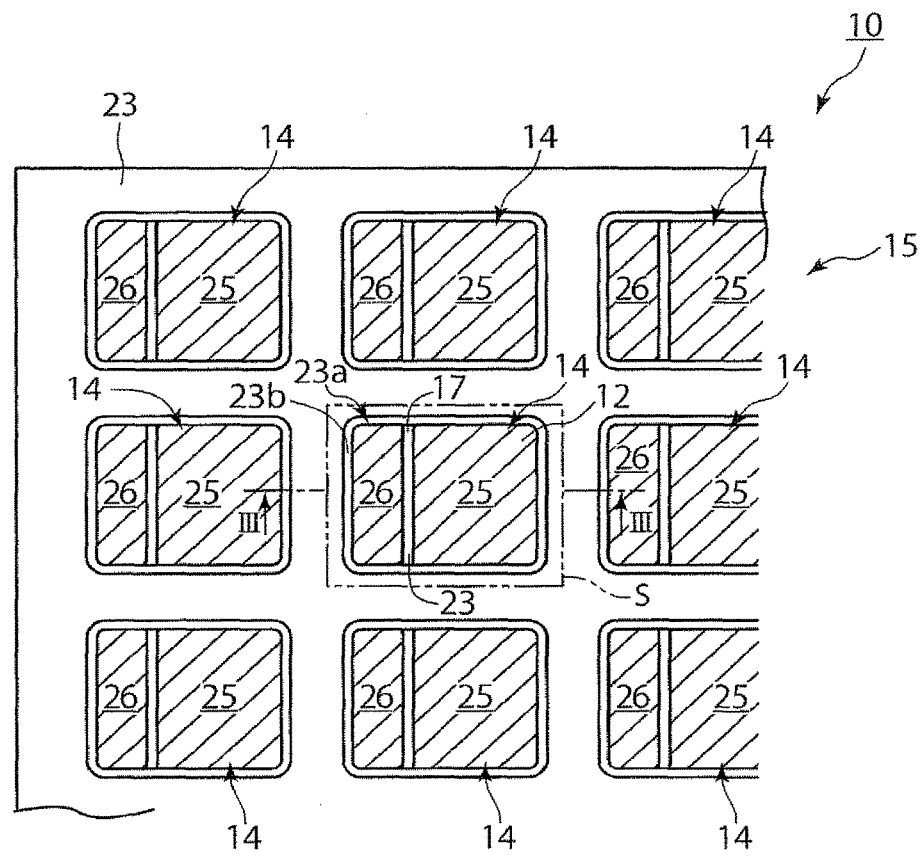
FIG. 4 is a plan view showing the resin-attached lead frame according to the first embodiment of the present invention.

Next, a resin-attached lead frame for resting LED elements according to the present embodiment is outlined below per FIGS. 3 and 4. FIGS. 3 and 4 are a cross-sectional view, and a plan view, respectively, of the resin-attached lead frame according to the present embodiment. In FIGS. 3 and 4, the same elements as those shown in FIGS. 1 and 2 are each assigned the same reference number or symbol.

Figure 5:
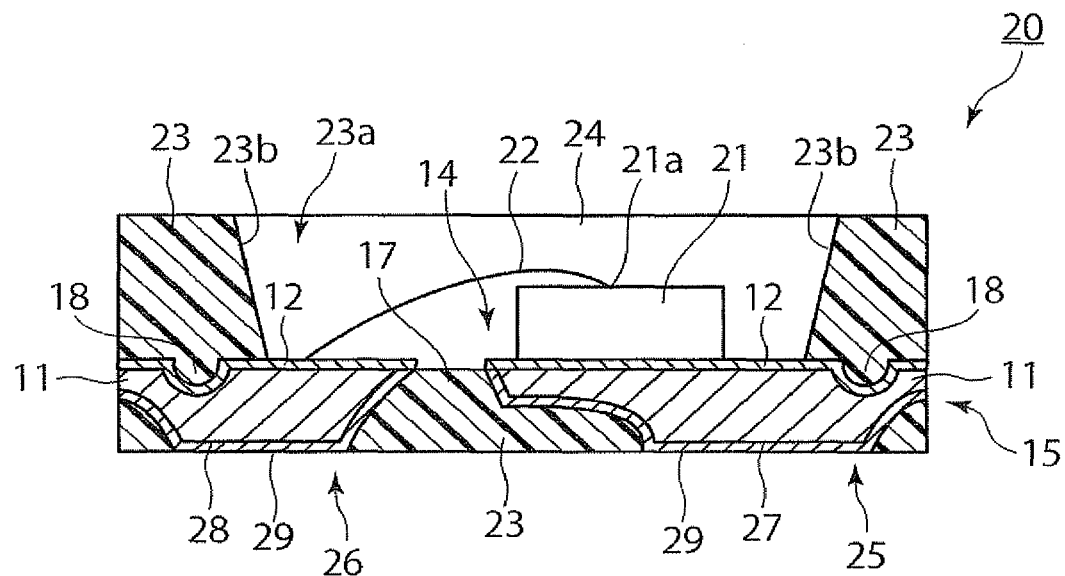
FIG. 5 is a sectional view of a semiconductor device relating to the first embodiment of the present invention, the sectional view being taken along line V-V in FIG. 6.
Figure 6:
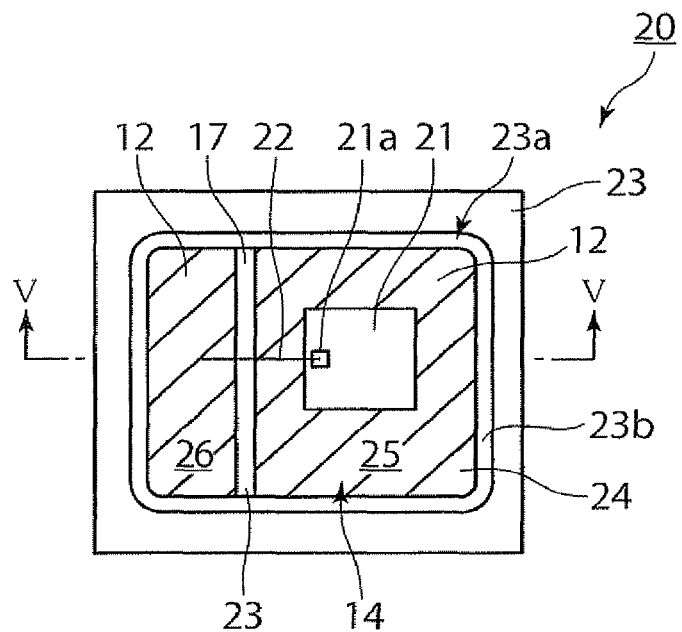
FIG. 6 is a plan view of the semiconductor device relating to the first embodiment of the present invention.
Figure 7:
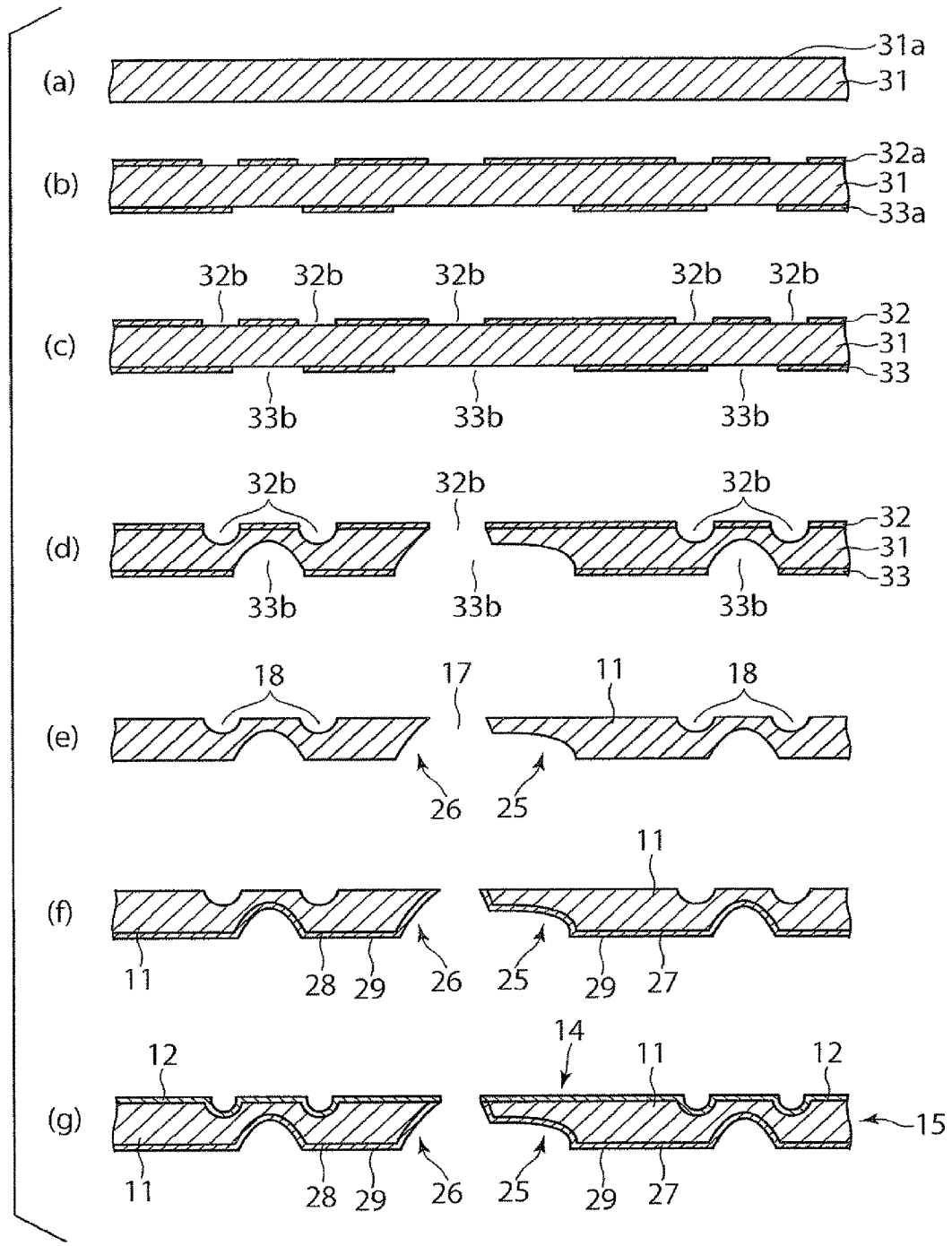
FIG. 7(a) to (g) shows steps for manufacturing the lead frame according to the first embodiment of the present invention.
Figure 8:
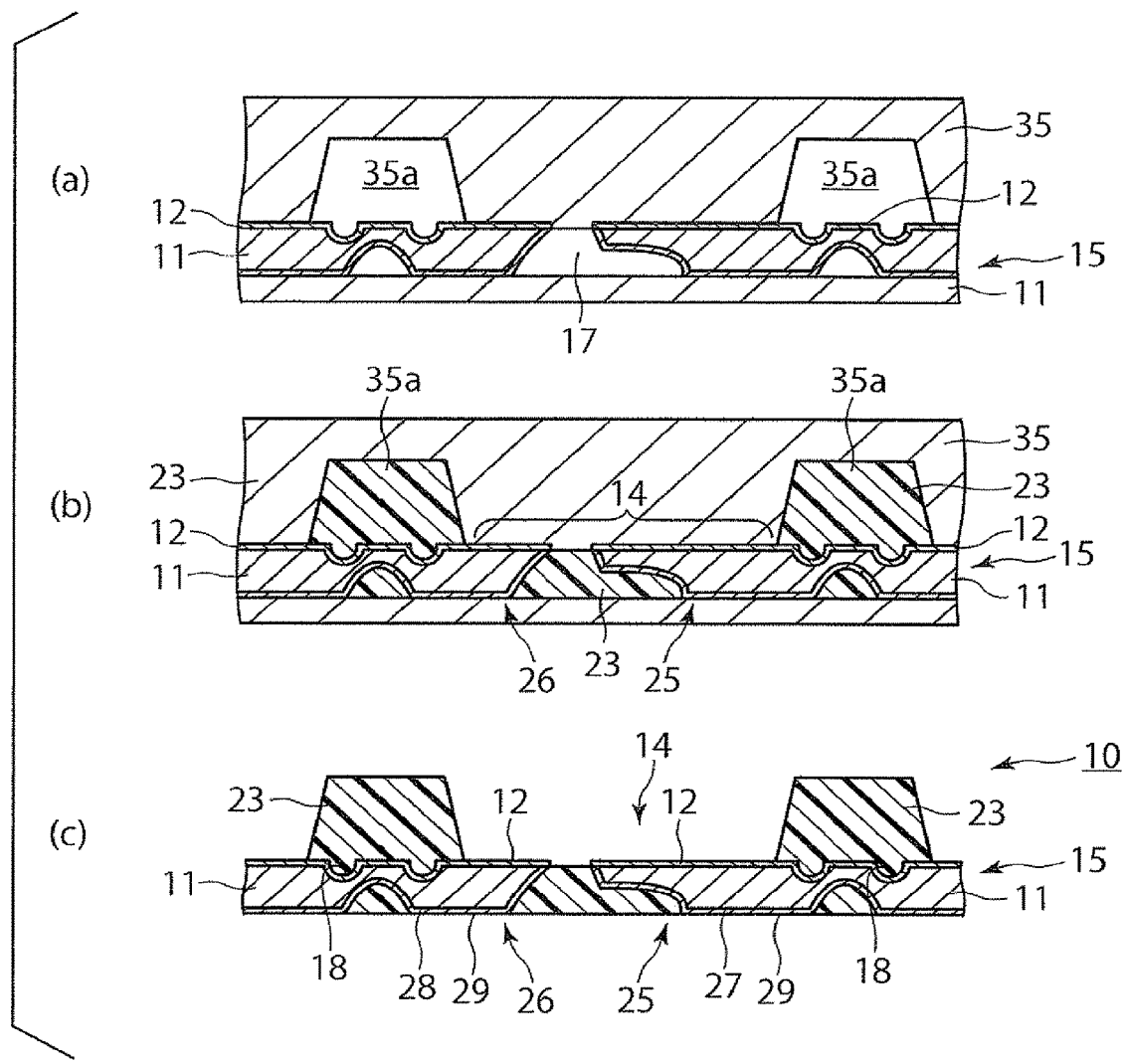
FIG. 8(a) to (c) shows further steps for manufacturing the resin-attached lead frame according to the first embodiment of the present invention.

The resin-attached lead frame 10 shown in FIGS. 3 and 4 is used to rest LED elements 21 (see FIGS. 5 and 6). The resin-attached lead frame 10 includes a lead frame 15 and a reflecting resin section 23 provided on the lead frame 15 and surrounding LED element resting regions 14.

The lead frame 15 includes a lead frame body 11, and the lead frame body 11 includes a plurality of die pads 25 and a plurality of lead portions 26 each spaced from one of the die pads 25. An LED element resting region 14 is formed over upper surfaces of each die pad 25 and each lead portion 26. The lead frame body 11 also has a vapor-deposited aluminum layer or sputtered aluminum layer 12 on upper surfaces of each LED element resting region 14. In FIG. 4, the vapor-deposited aluminum layer or sputtered aluminum layer 12 is shown in hatched form. The lead frame 15 is substantially of the same configuration as that shown in FIGS. 1 and 2, and detailed description of the lead frame configuration is therefore omitted herein.

The reflecting resin section 23 is integrated with the lead frame 15 and has a recess 23a having a substantially rectangular shape in a plane view and surrounding the LED element 21. Inner walls 23b are formed on the inside of the recess 23a. A space 17 filled in with the reflecting resin section 23 also exists between each die pad 25 and each lead portion 26. Details of the reflecting resin section 23 are described later herein.

While in the present embodiment the lead frame body 11 includes a plurality of die pads 25 and a plurality of lead portions 26 spaced from the corresponding die pad 25, the lead frame body 11 is not limited to this configuration and needs only to include at least one die pad 25 and one lead portion 26.

Semiconductor Device Configuration

Next, a semiconductor device fabricated using the resin-attached lead frame shown in FIGS. 2 and 3 is described below per FIGS. 5 and 6. FIGS. 5 and 6 are a cross-sectional view, and a plan view, respectively, of the semiconductor device (SON type) according to the present embodiment. In FIGS. 5 and 6, the same elements as those shown in FIGS. 1 to 4 are each assigned the same reference number or symbol.

As shown in FIGS. 5 and 6, the semiconductor device 20 includes a (singulated) lead frame 15 having a lead frame body 11 and a vapor-deposited aluminum layer or sputtered aluminum layer 12, an LED element 21 rested on a die pad 25 of the lead frame 15, and a bonding wire (electric conductor) 22 that electrically interconnects the LED element 21 and a lead portion 26 of the lead frame 15. The vapor-deposited aluminum layer or sputtered aluminum layer 12 is shown in hatched form in FIG. 6.

In addition, a reflecting resin section 23 with a recess 23a is provided around the LED element 21. The LED element 21 and the bonding wire 22 are integrally sealed with a light-transmissive sealing resin 24. The recess 23a in the reflecting resin section 23 is filled with the sealing resin 24. Of the lead frame body surface, a region in which the sealing resin 24 is provided corresponds to the LED element resting region 14.

Members that constitute the semiconductor device 20 are described in order below.

The lead frame 15 includes the lead frame body 11 having, as described above, the die pad 25 and the lead portion 26, and the vapor-deposited aluminum layer or sputtered aluminum layer 12 provided on the lead frame body 11 and functioning as a layer for reflecting light emitted from the LED element 21.

If a material formed from compound semiconductor single crystals such as GaP, GaAs, GaAlAs, GaAsP, AlIn-GaP, and/or InGaN, is appropriately selected for a light-emitting layer, a light-emission wavelength ranging between those of ultraviolet light and those of infrared light, inclusive, can be selected for the LED element 21. A commonly used conventional element can be used as such an LED element 21.

The LED element 21 is fixedly mounted on the die pad 25 (vapor-deposited aluminum layer or sputtered aluminum layer 12), inside the recess 23a of the reflecting resin section 23, via solder or a die-bonding paste. If a die-bonding paste is to be used, the die-bonding paste can be that formed from a light-resistant epoxy resin or silicone resin.

The bonding wire 22 is formed from a highly electroconductive material such as gold, with one end thereof being connected to a terminal section 21a of the LED element 21, and with the other end thereof being connected to an upper surface (on the vapor-deposited aluminum layer or sputtered aluminum layer 12) of the lead portion 26.

The reflecting resin section 23 is formed by, for example, injection-molding a thermoplastic resin over the resin-attached lead frame 10 or by, for example, injection-molding or transfer-molding a thermosetting resin over the resin-attached lead frame 10. The reflecting resin section 23 can vary in shape according to a design of a mold used during the injection molding or transfer molding of the resin. For example, the entire reflecting resin section 23 can be formed into a regularly parallelepipedic shape as shown in FIGS. 5 and 6, or formed into a shape of a cylinder, pyramid/cone, or the like. The recess 23a can have, for example, either a rectangular, circular, elliptical, or polygonal base. The inner walls 23b of the recess 23a may have either a rectilinear cross-sectional shape as shown in FIG. 5, or have a curvilinear one.

A material excelling particularly in heat resistance, weatherability, and mechanical strength is desirably selected for the thermoplastic resin or thermosetting resin used in the reflecting resin section 23. The useable kinds of thermoplastic resin materials are polyamide, polyphthalamide (PPA), polyphenylene sulfide, liquid-crystal polymers, polyether sulphone, polyetherimide, polybutylene terephthalate, polyolefin, cyclopolyolefin, and the like. The useable kinds of thermosetting resin materials are silicone, epoxies, polyimides, and the like. If either of titanium dioxide, zirconium dioxide, potassium titanate, aluminum nitride, and boron nitride is added as a light-reflecting agent to the resin, this increases a reflectance of the light from the light-emitting element, at the base and inner walls 23b of the recess 23a, thus increasing light-extraction efficiency of the entire semiconductor device 20.

For enhancing light-extraction efficiency, a material high in an index of refraction as well as in light transmittance at a light-emission wavelength of the semiconductor device 20 is desirably selected as the sealing resin 24. An epoxy resin or a silicone resin can therefore be selected as a resin that satisfies high heat resistance, weatherability, and mechanical strength requirements. To use a high-luminance LED, in particular, as the LED element 21, the sealing resin 24 is preferably formed from a highly weatherable silicone resin material since the sealing resin 24 is exposed to strong light.

Method of Manufacturing the Lead Frame and the Resin-Attached Lead Frame

Next, a method of manufacturing the lead frame 15 shown in FIGS. 1 and 2, and the resin-attached lead frame 10 shown in FIGS. 3 and 4 are described below using FIGS. 7(a) to (g) and 8(a) to (c).

First as shown in FIG. 7(a), a metallic substrate 31 of a flat-plate shape is provided. As outlined above, the metallic substrate 31 can be that formed from copper, a copper alloy, a 42-alloy (a Fe alloy with a 42% Ni content), and/or the like. Both sides of the metallic substrate 31 are preferably degreased and cleaned beforehand.

In addition, the metallic substrate 31 preferably has its upper surface 31a preworked into a mirror-like finish to have a roughness level of 0.01 µm to 0.1 µm in arithmetic average height "Sa" and 2 µm to 18 µm in roughness curvilinear element average length "Sm". Examples of such mirror-like finishing methods can be by using a mirror-like finishing roller during final rolling of the material, or by conducting double-side mirror-like copper plating.

Next as shown in FIG. 7(b), entire upper and lower surfaces of the metallic substrate 31 are coated with photosensitive resists 32a and 33a, respectively, and then the resists are dried. The photosensitive resists 32a, 33a can be conventionally known ones.

Following the above, light exposure of the metallic substrate 31 via a photomask takes place, and developing further follows. Etching resist layers 32 and 33 with desired openings 32b and 33b, respectively, are then formed as shown in FIG. 7(c).

Next as shown in FIG. 7(d), etching of the metallic substrate 31 with an etchant occurs using the etching resist layers 32, 33 as anti-etching films. An appropriate chemical as the etchant can be selected according to the kind of metallic substrate material to be used. For example, to use copper as the material of the metallic substrate 31, the substrate can usually be spray-etched from both sides using an aqueous ferric chloride solution.

After that, the etching resist layers 32, 33 are peeled off, whereby the lead frame body 11 with die pads 25 and lead portions 26 spaced from the die pads 25 will then be obtained as shown in FIG. 7(e). Providing half etching at this time will also form grooves 18 on the upper surface of the lead frame body 11.

Next, the lower surface of the lead frame body 11 is provided with electrolytic plating to deposit a metal (silver) onto a first outer lead portion 27 and a second outer lead portion 28, thus forming a plated layer 29 for enhanced contact with the solder. This state is shown in FIG. 7(f). In this case, the lead frame body 11 goes through steps such as electrolytic degreasing, pickling, chemical polishing, copper striking, water washing, neutral degreasing, cyanide cleaning, and silver plating, in that order. This forms the plated layer 29 on the first outer lead portion 27 and the second outer lead portion 28. An electroplating solution used in the silver-plating step can be, for example, a silver-plating solution composed mainly of silver cyanide. In an actual process, water washing is added between steps, as required.

Next, aluminum is vapor-deposited or sputtered onto the surface of the lead frame body 11, whereby as shown in FIG. 7(g), the vapor-deposited aluminum layer or sputtered aluminum layer 12 functioning as a reflecting layer is formed on the entire surface of the lead frame body 11 including the LED element resting region 14.

The formation of the vapor-deposited aluminum layer or sputtered aluminum layer is, more specifically, not limited to the above method, but in a case of vapor deposition, the vapor-deposited aluminum layer 12 can be formed on the surface of the lead frame body 11 by using parameters of $9 \times 10^{-6}$ torr in maximum attainable degree of vacuum and 1.5 nm/sec in deposition rate. In a case of sputtering, the sputtered aluminum layer 12 can be formed on the surface of the lead frame body 11 by using parameters of $4 \times 10^{-6}$ torr in maximum attainable degree of vacuum, $5 \times 10^{-3}$ torr in film-forming degree of vacuum, and 900 W in sputtering power (for a target size of 5 inches by 18 inches).

In this way, the lead frame 15 with the lead frame body 11 and the vapor-deposited aluminum layer or sputtered aluminum layer 12 formed on the lead frame body 11 is obtained. This state is shown in FIG. 7(g).

Next, the reflecting resin section 23 is formed on the vapor-deposited aluminum layer or sputtered aluminum layer 12 of the lead frame 15. The formation of the reflecting resin section 23 is described in further detail below.

First as shown in FIG. 8(a), the lead frame 15 that has been obtained through the steps shown in FIG. 7(a) to (g) is mounted in a mold 35 of an injection molding machine or transfer molding machine (not shown). Cavities 35a appropriate for a shape of the reflecting resin section 23 are preformed in the mold 35.

Next, a thermosetting resin is poured from a resin supply section (not shown) of the injection molding machine or transfer molding machine into the mold 35 and then allowed to set. The reflecting resin section 23 is then formed in a section of the lead frame surface, exclusive of the LED element resting region 14, as shown in FIG. 8(b). At this time, the reflecting resin section 23 is also generated in the space 17 between the die pad 25 and the lead portion 26.

The lead frame 15 with the formed reflecting resin section 23 is removed from the mold 35 after that. In this way, the resin-attached lead frame 10 (see FIGS. 3 and 4) with the reflecting resin section 23 and the lead frame 15 is obtained. This state is shown in FIG. 8(c).

Method of Manufacturing the Semiconductor Device

Next, a method of manufacturing the semiconductor device 20 shown in FIGS. 5 and 6 is described below using FIG. 9(a) to (f).

First, the resin-attached lead frame 10 with the lead frame 15 and reflecting resin section 23 described in the steps of FIGS. 7(a) to (g) and 8(a) to (c) is fabricated. FIG. 9(a) shows the fabricated lead frame 10.

Next, an LED element 21 is mounted on the die pad 25 of the lead frame 15. In this case, as shown in FIG. 9(b), the LED element 21 is rested on and fixed to the die pad 25 (the vapor-deposited aluminum layer or sputtered aluminum layer 12) of the lead frame 15 by use of solder or a die-bonding paste (this step is called die attaching).

Next as shown in FIG. 9(c), the terminal section 21a of the LED element 21 and an upper surface of the lead portion 26 are electrically connected to each other via a bonding wire 22 (this step is called wire bonding).

After this, the recess 23a in the reflecting resin 23 is filled in with a sealing resin 24, whereby the LED element 21 and the bonding wire 22 are sealed with the sealing resin 24. This state is shown in FIG. 9(d).

Next as shown in FIG. 9(e), the lead frame 15 is separated for each LED element 21 by dicing the sections of the lead frame 15 that correspond to the reflecting resin section 23 between the LED elements 21. At this time, the lead frame 15 is first rested on and fixed to a dicing tape 37, and then the reflecting resin section 23 between the LED elements 21 is cut in a vertical direction using, for example, a blade 38 made of a diamond grinding wheel or the like.

The semiconductor device 20 shown in FIGS. 5 and 6 is thus obtained. FIG. 9(f) shows the semiconductor device 20 existing after the reflecting resin section 23 has been cut.

Operational Effects of the Present Embodiment

Figure 10:
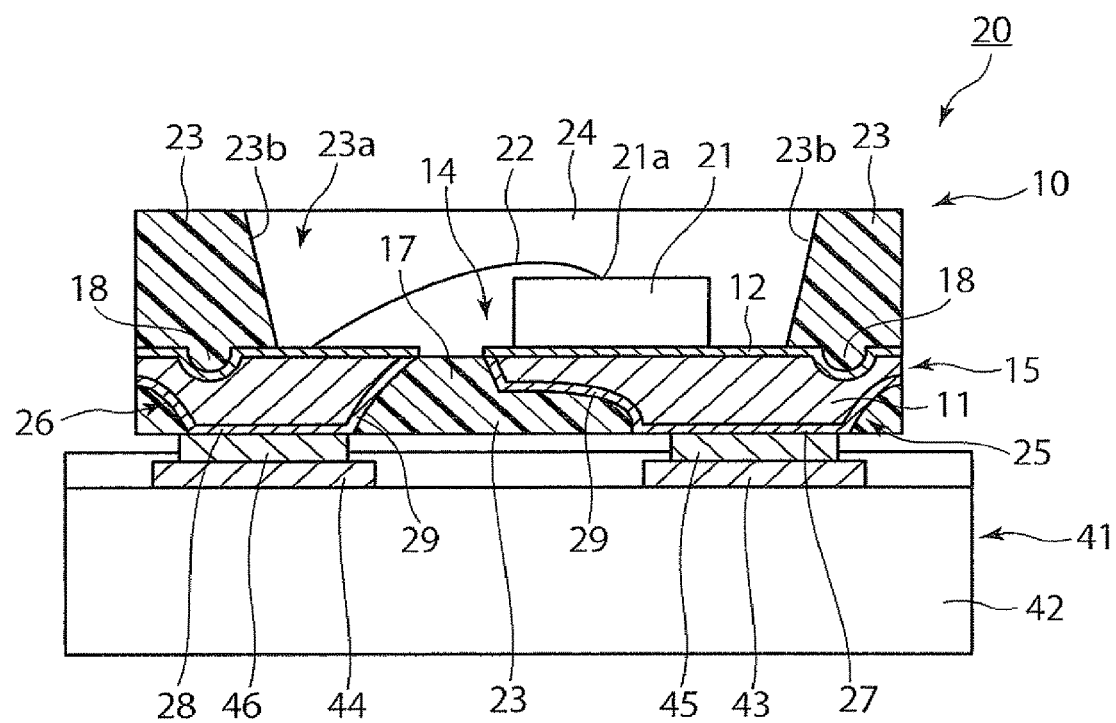
FIG. 10 is a sectional view showing the semiconductor device disposed on an electrical interconnection substrate.

Next, operational effects of the present embodiment having the above configuration are described below using FIG. 10. FIG. 10 is a sectional view showing the semiconductor device disposed on an electrical interconnection substrate.

As shown in FIG. 10, the semiconductor device 20 according to the present embodiment is disposed on the interconnection substrate 41. The interconnection substrate 41 includes a substrate body 42 and interconnection terminal sections 43 and 44 formed on the substrate body 42. The terminal section 43 of the two interconnection terminal sections is connected to a first outer lead portion 27 via a connecting solder portion 45. The other terminal section 44 is connected to a second outer lead portion 28 via a connecting solder portion 46.

In this way, the semiconductor device 20 is disposed on the interconnection substrate 41. In addition, when current is applied between the paired interconnection terminal sections 43 and 44, the current is further applied to the LED element 21 on the die pad 25, thus activating the LED element 21.

At this time, light from the LED element 21 passes through the sealing resin 24 and is released from an upper surface of the sealing resin 24, or reflects from the inner walls 23b of the recess 23a in the reflecting resin section 23 and is released from the surface of the sealing resin 24. Alternatively, the light from the LED element 21 reflects from the surface of the vapor-deposited aluminum layer or sputtered aluminum layer 12 and is released from the surface of the sealing resin 24.

In the present embodiment, the vapor-deposited aluminum layer or sputtered aluminum layer 12 is provided on the surface of the LED element resting region 14 of the lead frame body 11. This makes the light from the LED element 21 reflect efficiently, hence enhancing extraction efficiency of the light from the LED element 21. In addition, the above prevents the lead frame 15 from degrading with time, since the aluminum constituting the vapor-deposited aluminum layer or sputtered aluminum layer 12 is free from degradation due to presence of hydrogen sulfide in air.

As described above, in accordance with the present embodiment, the vapor-deposited aluminum layer or sputtered aluminum layer 12 is provided on the surface of each LED element resting region 14 of the lead frame body 11. This makes the light from the LED element 21 reflect efficiently and hence enhances the extraction efficiency of the light from the LED element 21. In addition, the above prevents the lead frame 15 from degrading with time.

Furthermore, the provision of the vapor-deposited aluminum layer or sputtered aluminum layer 12 in the present embodiment raises adhesion between the lead frame 15 and the sealing resin 24. The state of wire bonding with the bonding wire 22 and the die attaching of the LED elements 21 are also maintained at an appropriate level.

If the vapor-deposited aluminum layer or sputtered aluminum layer 12 is provided via a bonding layer formed from a silver-plated layer, since on the section subjected to wire bonding, the underlying silver (the silver-plated layer) will break the thin aluminum and form an alloy of the silver and the wire, a further desirable bond will be obtained and stronger wire bonding attained.

If the vapor-deposited aluminum layer or sputtered aluminum layer 12 is not provided on the section subjected to wire bonding, since energy for the silver to break an oxide film of the aluminum during wire bonding is not needed, a bonding temperature, parameters relating to use of ultrasonic waves, and other parameters can be alleviated.

If the vapor-deposited aluminum layer or sputtered aluminum layer 12 is not provided on the section where the LED element 21 is to be mounted, a heat-releasing route via the die pad 25 becomes short, which results in improved heat release characteristics.

For example, if the vapor-deposited aluminum layer or sputtered aluminum layer 12 is provided via a bonding layer formed from a silver-plated layer and not provided on the section subjected to wire bonding, since, the surface of the silver-plated layer can be directly wire-bonded as in conventional technology, a bond with a bonding wire 22 of gold, for example, can be maintained at a high strength level.

For example, if the vapor-deposited aluminum layer or sputtered aluminum layer 12 is provided via a bonding layer formed from a silver-plated layer and not provided on the section where the LED element 21 is to be mounted, when the LED element 21 is to be connected by soldering, for example, high wettability of the solder on that section generates no void in the solder and allows reliable mounting of the entire LED element surface.

Second Embodiment

Next, a second embodiment of the present invention is described below referring to FIGS. 11 to 16. FIGS. 11 to 16 show the second embodiment of the present invention. The second embodiment shown in FIGS. 11 to 16 differs from the first embodiment in that a vapor-deposited aluminum layer or sputtered aluminum layer 12 is also provided on inner walls 23b of a reflecting resin section 23, and all other elements are substantially the same as those in the first embodiment. In FIGS. 11 to 16, the same elements as those of the embodiment shown in FIGS. 1 to 10 are each assigned the same reference number or symbol, and detailed description of these elements is omitted herein.

Resin-Attached Lead Frame Configuration

Figure 11:
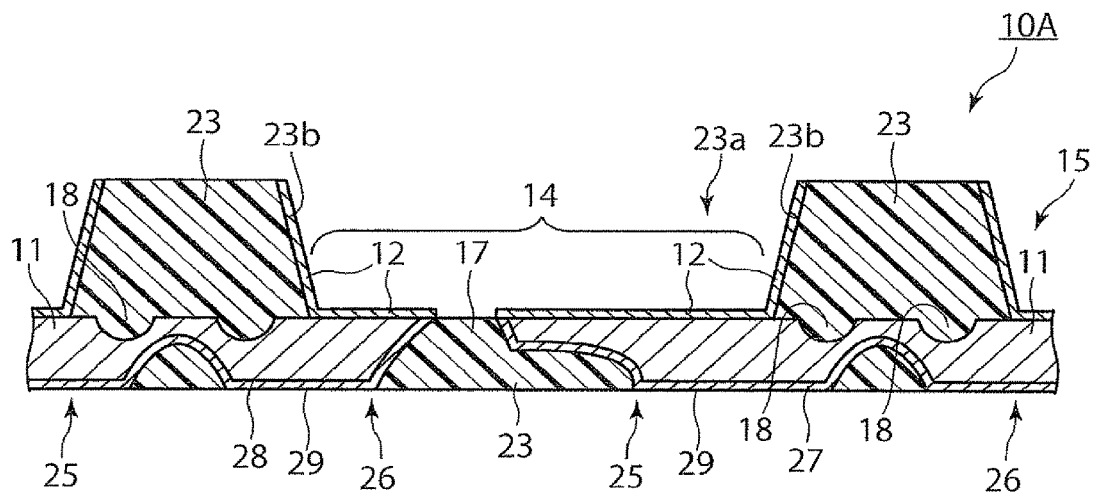
FIG. 11 is a sectional view of a resin-attached lead frame according to a second embodiment of the present invention, the sectional view being taken along line XI-XI in FIG. 12.
Figure 12:
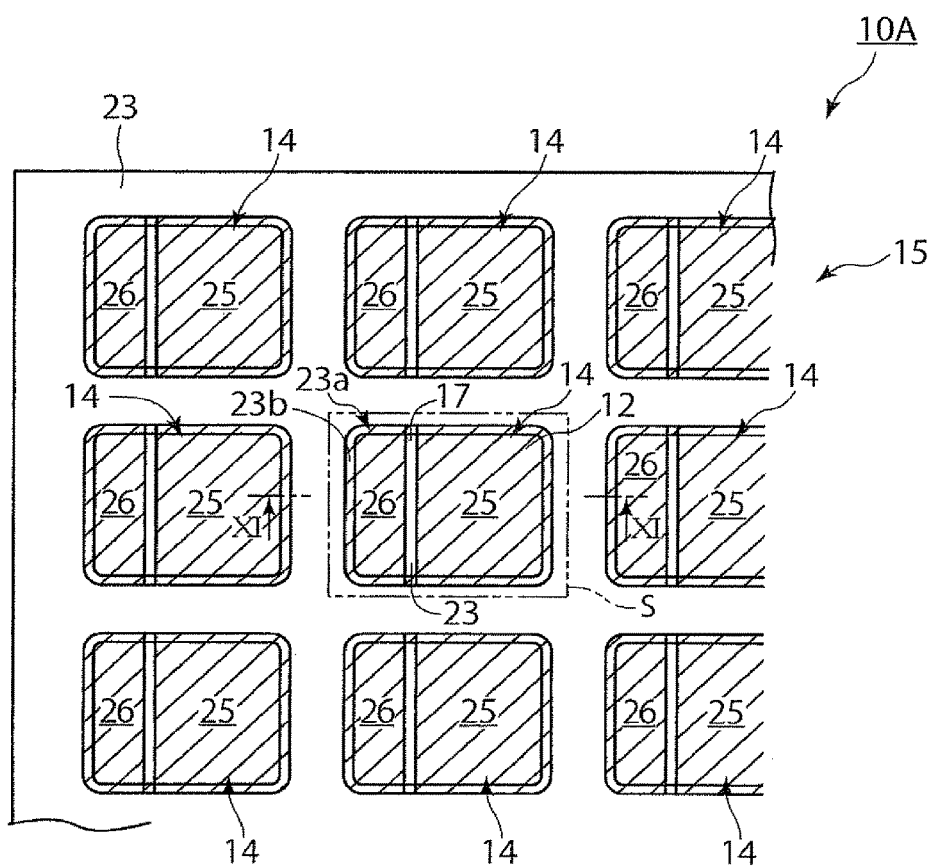
FIG. 12 is a plan view showing the resin-attached lead frame according to the second embodiment of the present invention.

First, a resin-attached lead frame according to the present embodiment is outlined below per FIGS. 11 and 12. FIGS. 11 and 12 are a cross-sectional view, and a plan view, respectively, of the resin-attached lead frame according to the present embodiment.

As shown in FIGS. 11 and 12, the resin-attached lead frame 10A according to the present embodiment includes a lead frame 15 and a reflecting resin section 23.

The lead frame 15 includes a lead frame body 11, and the lead frame body 11 includes a plurality of die pads 25 and a plurality of lead portions 26 each spaced from one of the die pads 25. An LED element resting region 14 is formed over upper surfaces of each die pad 25 and each lead portion 26. The reflecting resin section 23 is provided in such a form as to surround each of the LED element resting regions 14 of the lead frame body 11.

In the present embodiment, a metallic layer (in this case, a vapor-deposited aluminum layer or sputtered aluminum layer) 12 is provided on upper surfaces of each LED element resting region 14 of the lead frame body 11. The metallic layer 12 is also provided on the inner walls 23*b* of the reflecting resin section 23. That is to say, the vapor-deposited aluminum layer or sputtered aluminum layer 12 continuously extends along the inner walls 23*b* of the reflecting resin section 23 from the surface of the LED element resting region 14. The vapor-deposited aluminum layer or sputtered aluminum layer 12 is shown in hatched form in FIG. 12. The metallic layer 12 formed on the inner walls 23*b* of the reflecting resin section 23 as well as on the surface of the LED element resting region 14 is not limited to a vapor-deposited aluminum layer or sputtered aluminum layer and may include layers of silver, rhodium, palladium, platinum, copper, and/or the like.

In this case, the vapor-deposited aluminum layer or sputtered aluminum layer 12, unlike that of the resin-attached lead frame 10 shown in FIGS. 3 and 4, is not provided between the lead frame body 11 and the reflecting resin section 23. Instead, the vapor-deposited aluminum layer or sputtered aluminum layer 12 is provided only in each LED element resting region 14 on the surface of the lead frame body 11.

In addition, as shown in FIG. 12, in order to prevent short-circuiting between the die pad 25 and the lead portion 26, the vapor-deposited aluminum layer or sputtered aluminum layer 12 is not provided on a section adjacent to a space 17, on the inner walls 23*b* of the reflecting resin section 23.

The resin-attached lead frame 10A is substantially of the same configuration as that of the resin-attached lead frame 10 shown in FIGS. 3 and 4, and detailed description of the lead frame configuration is therefore omitted herein.

While in the present embodiment the lead frame body 11 includes the die pads 25 and the lead portions 26 spaced from the die pads 25, the lead frame body 11 is not limited to this configuration and needs only to include at least one die pad 25 and one lead portion 26.

Figure 17:
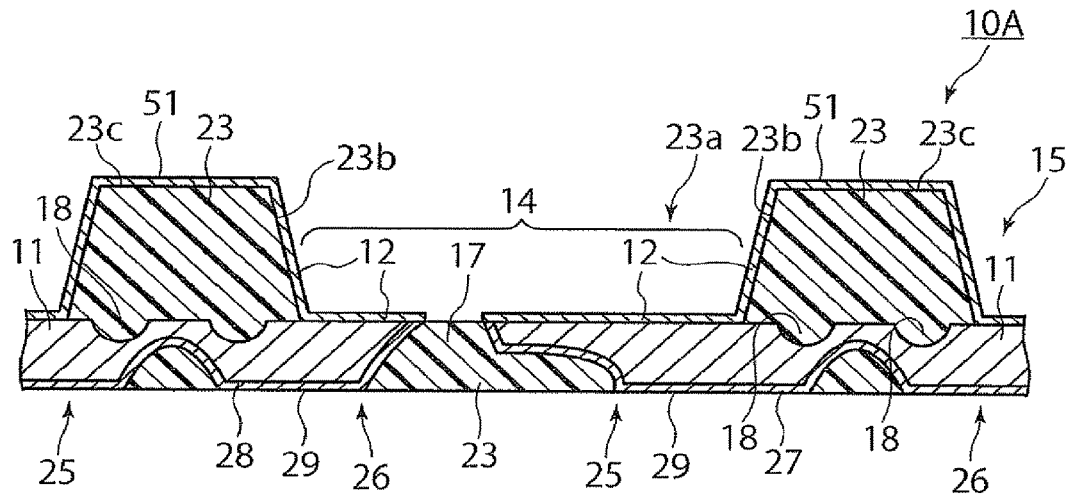
FIG. 17 is a sectional view showing a modification of the resin-attached lead frame according to the second embodiment of the present invention.

FIG. 17 shows a resin-attached lead frame 10A according to a modification of the present embodiment. In the resin-attached lead frame 10A of FIG. 17, a reflecting metallic layer 51 is provided on an upper surface 23C of the reflecting resin section 23. The reflecting metallic layer 51 may be formed from a vapor-deposited aluminum layer or sputtered aluminum layer 12 or formed from other such kinds of metallic layers as of silver, rhodium, palladium, platinum, and/or copper. When a semiconductor device 20 is built into an illumination device, part of the light emitted from the LED element 21 will commonly or may reflect from the illumination device and return to an upper section of the semiconductor device 20. Providing the reflecting metallic layer 51 as described above, however, prevents the light from being absorbed into the semiconductor device 20 after the light has returned to the upper section thereof.

Figure 9:
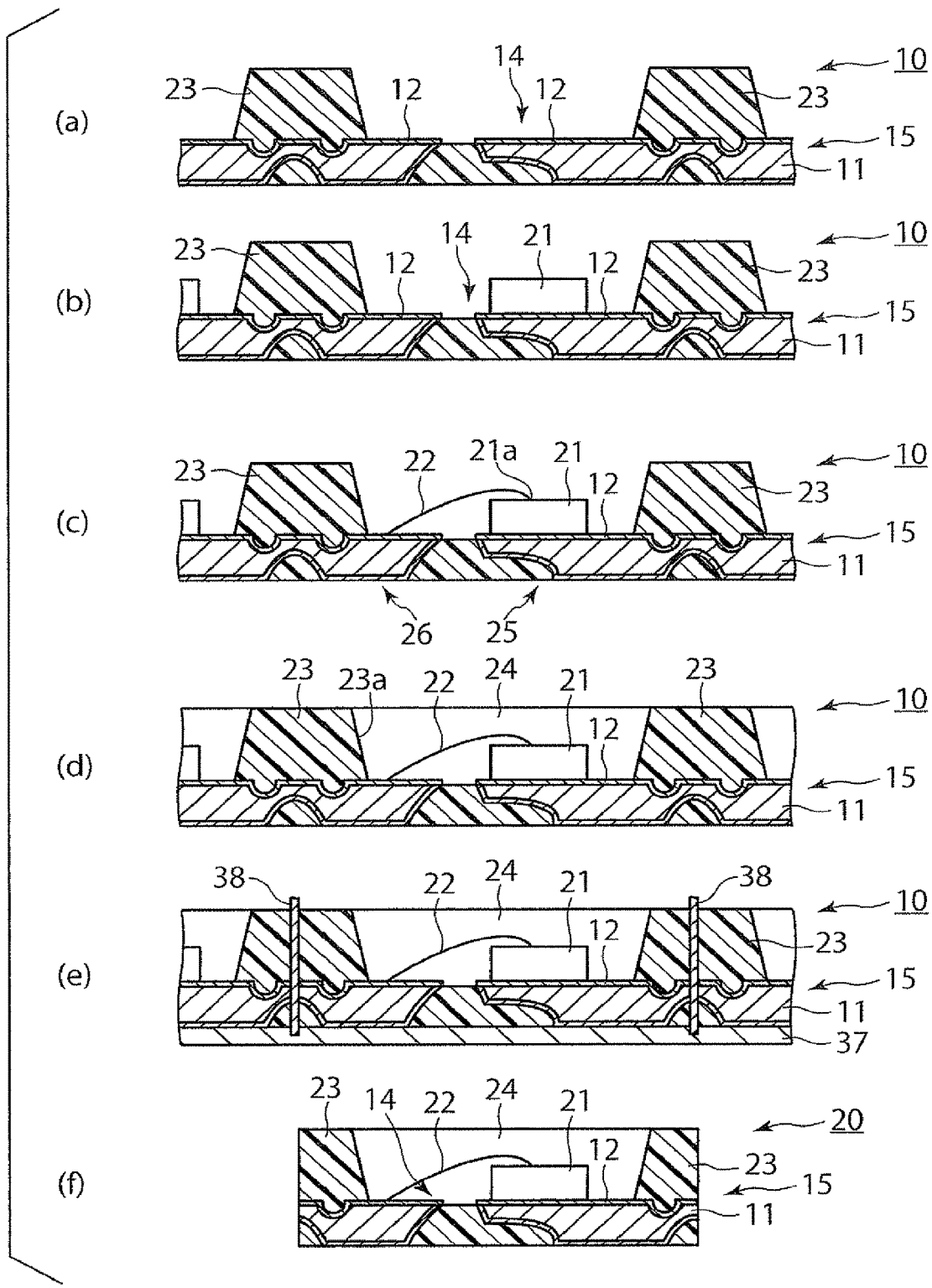
FIG. 9(a) to (f) shows steps for manufacturing the semiconductor device according to the first embodiment of the present invention.
Figure 18:
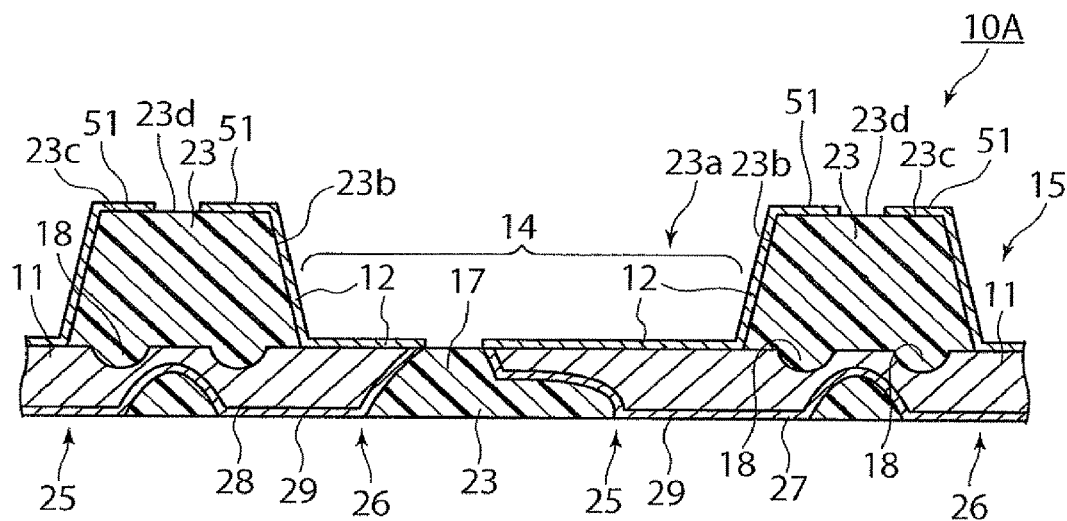
FIG. 18 is a sectional view showing another modification of the resin-attached lead frame according to the second embodiment of the present invention.

FIG. 18 shows a resin-attached lead frame 10A according to another modification of the present embodiment. The resin-attached lead frame 10A shown in FIG. 18 differs from that of the modification shown in FIG. 17, in that a reflecting metallic layer 51 is not provided at a region 23*d* on an upper surface 23*c* of a reflecting resin section 23, the region 23*d* being a section that will be later cut by dicing as shown in FIG. 9(*e*) and where the reflecting resin section 23 is exposed. The reflecting metallic layer 51 is provided at all other regions on the upper surface 23*c* of the reflecting resin section 23. The section 23*d* at which the reflecting resin section 23 is exposed may exist nearly on a central section of the upper surface 23*c* of the reflecting resin section 23 or on a position shifted in a horizontal direction from the central section of the upper surface 23*c*. In this case, no foreign substances such as dicing swarf or metallic particles of the highly electroconductive aluminum or other materials will be included, which will in turn prevent short-circuiting due to any metallic foreign substances left after cutting.

Figure 19:
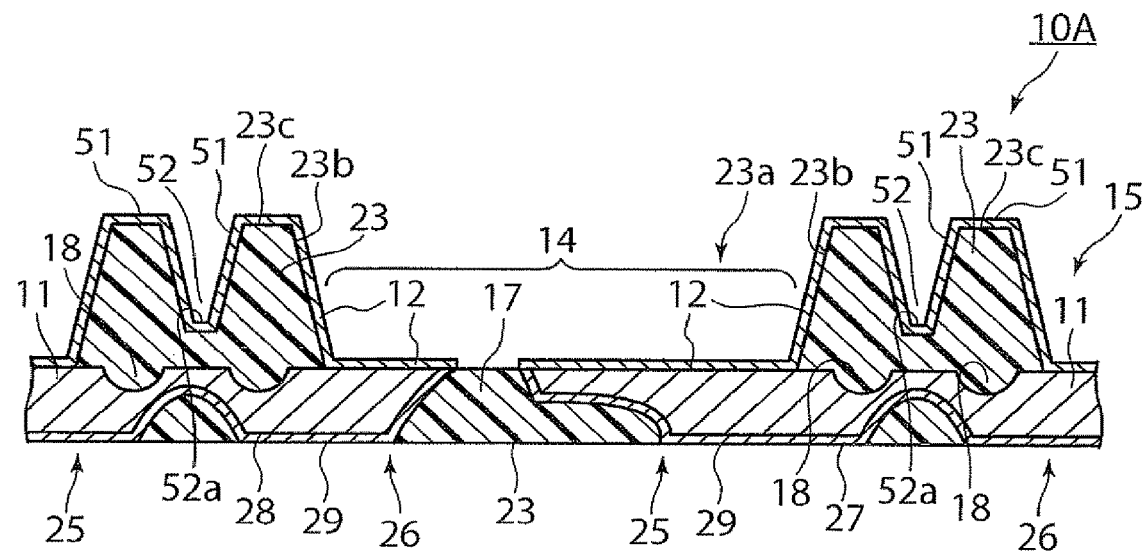
FIG. 19 is a sectional view showing yet another modification of the resin-attached lead frame according to the second embodiment of the present invention.

FIG. 19 shows a resin-attached lead frame 10A according to yet another modification. The resin-attached lead frame 10A shown in FIG. 19, unlike that of the modification shown in FIG. 17, has a recess 52 concaved inward nearly in a central portion of an upper surface 23*c* of a reflecting resin section 23. A reflecting metallic layer 51 is provided in an entire internal region of the recess 52 (including a base 52*a*) in FIG. 19. Since a reflecting metallic layer 51 does not commonly exist in a section that has been cut by dicing, this section has a property of absorbing light.

Additionally, when a semiconductor device 20 is built into an illumination device, part of the light emitted from the LED element 21 will commonly or may reflect from the illumination device and return to an upper section of the semiconductor device 20. Since the region that absorbs the light (i.e., the section cut by dicing) is formed to have a small shape and size in FIG. 19, this geometry prevents the light from being absorbed into the semiconductor device 20 after the light has returned to the upper section thereof.

Figure 20:
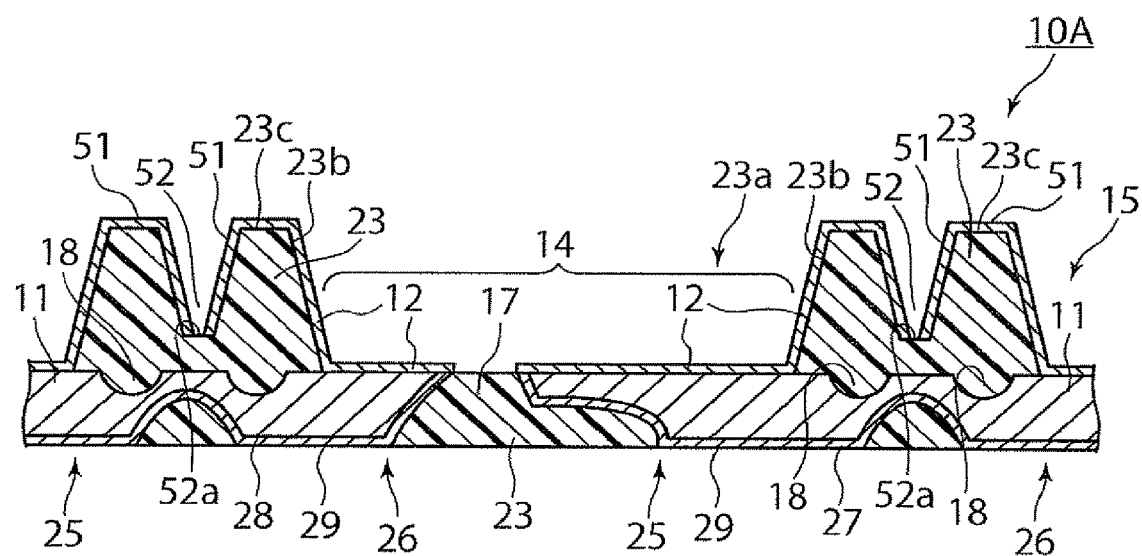
FIG. 20 is a sectional view showing a further modification of the resin-attached lead frame according to the second embodiment of the present invention.

FIG. 20 shows a resin-attached lead frame 10A according to a further modification. The resin-attached lead frame 10A shown in FIG. 20 differs from that of the modification shown in FIG. 19, in that a reflecting metallic layer 51 is not provided at a base 52*a* of a recess 52, the base 52*a* being a section that will be later cut by dicing as shown in FIG. 9(*e*) and where a reflecting resin section 23 is exposed. The reflecting metallic layer 51 is provided at all other regions of the recess 52. This configuration prevents light from being absorbed into a semiconductor device 20 after the light has returned to an upper section thereof. In addition, no foreign substances such as dicing swarf or metallic particles of the highly electroconductive aluminum or other materials will be included, which will in turn prevent short-circuiting due to any metallic foreign substances left after cutting.

Semiconductor Device Configuration

Figure 13:
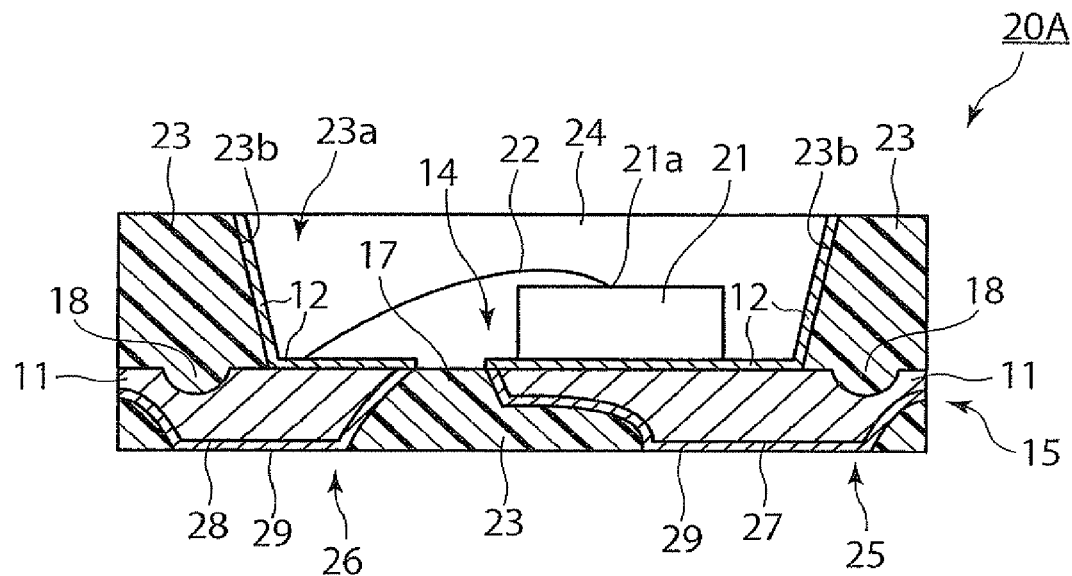
FIG. 13 is a sectional view of a semiconductor device relating to the second embodiment of the present invention, the sectional view being taken along line XIII-XIII in FIG. 14.

Next, a semiconductor device fabricated using the resin-attached lead frame shown in FIGS. 11 and 12 is described below per FIGS. 13 and 14. FIG. 13 is a sectional view of the semiconductor device (SON type), and FIG. 14 is a plan view thereof.

Figure 14:
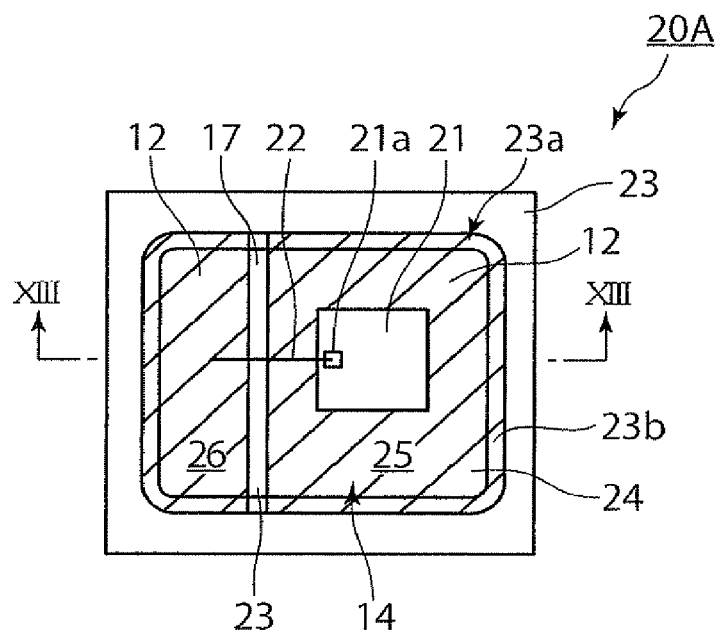
FIG. 14 is a plan view of the semiconductor device relating to the second embodiment of the present invention.
Figure 15:
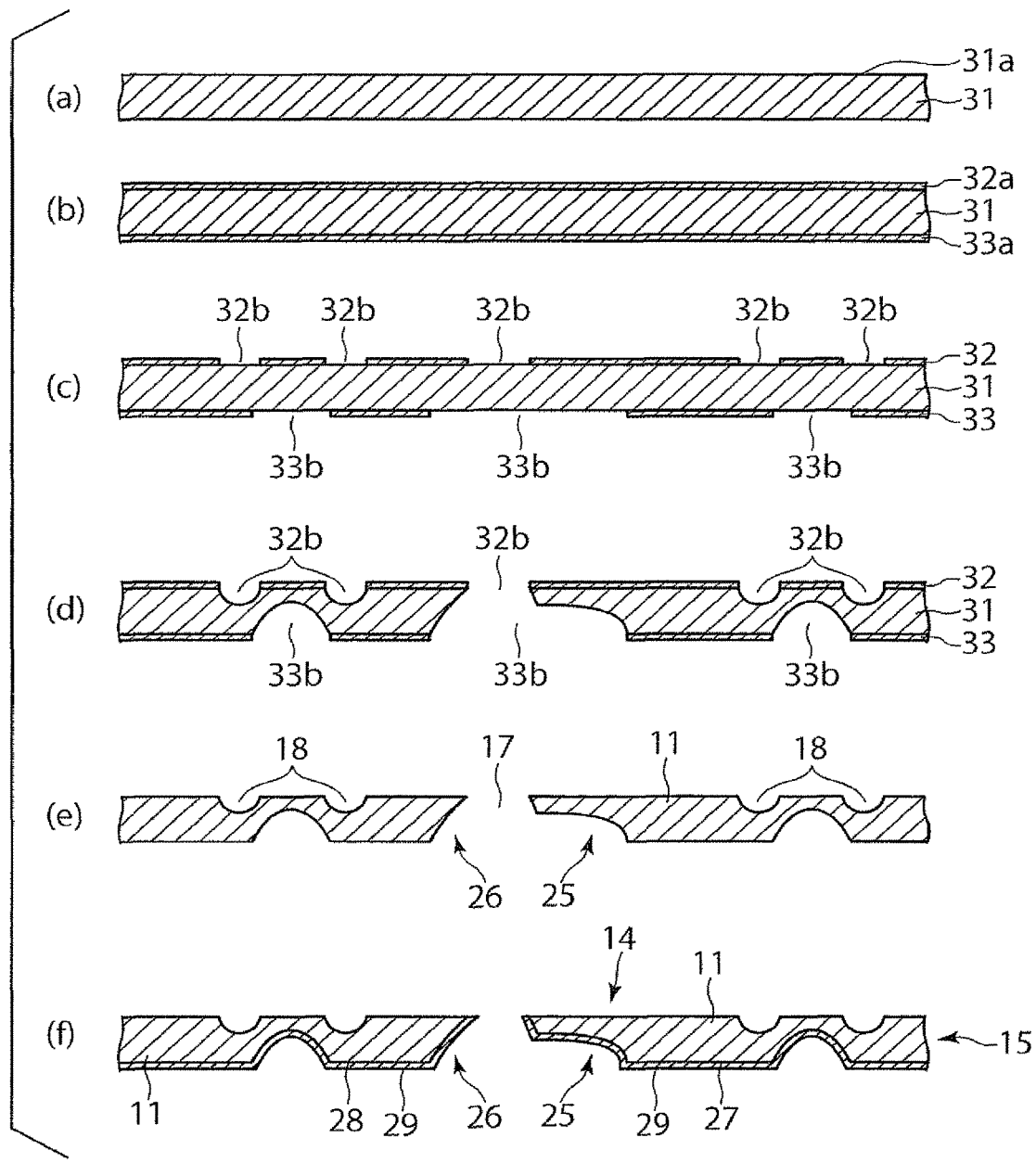
FIG. 15(a) to (f) shows steps for manufacturing the lead frame according to the second embodiment of the present invention.
Figure 16:
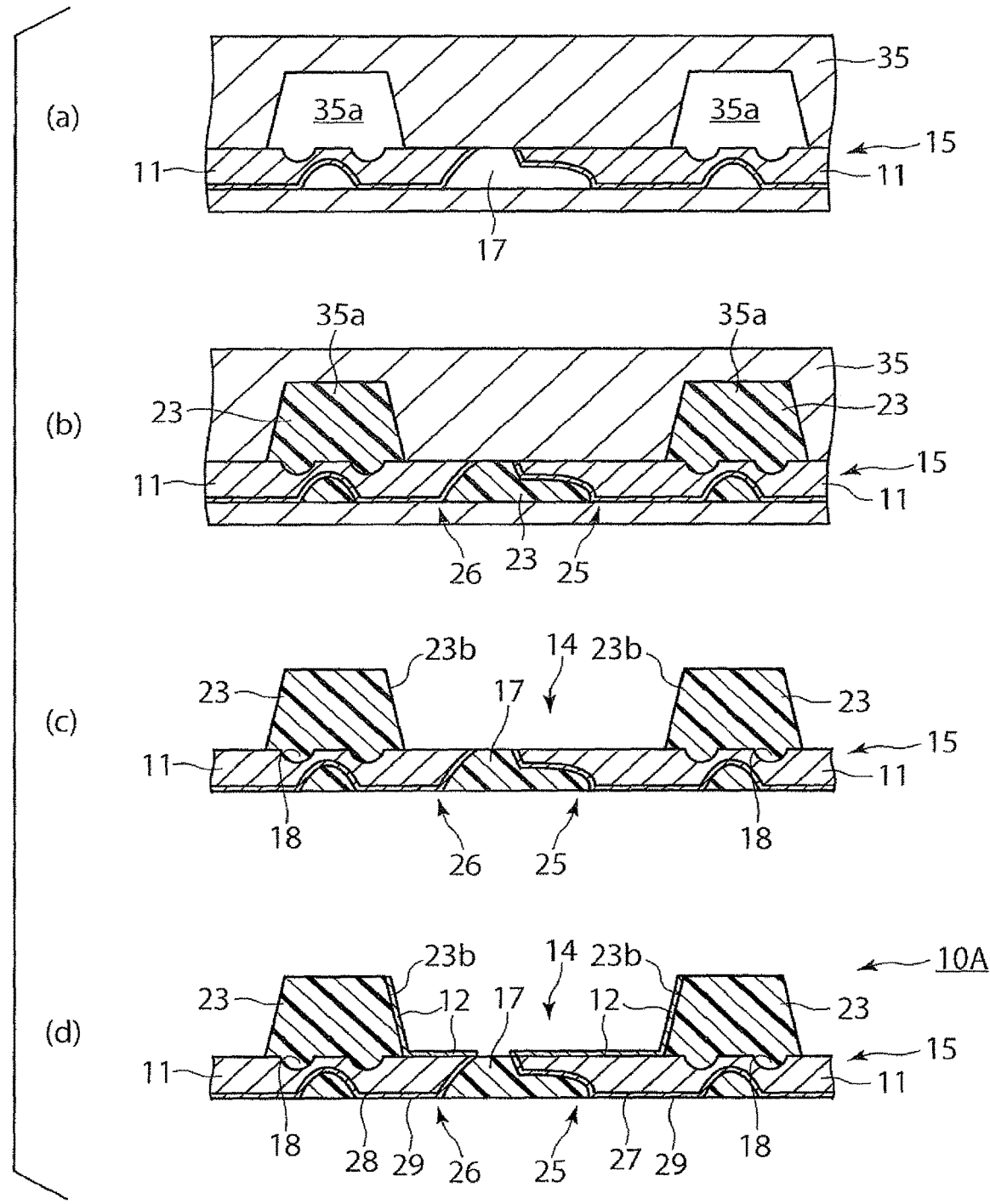
FIG. 16(a) to (d) shows further steps for manufacturing the resin-attached lead frame according to the second embodiment of the present invention.

As shown in FIGS. 13 and 14, the semiconductor device 20A includes a (singulated) lead frame 15 having a lead frame body 11 and a vapor-deposited aluminum layer or sputtered aluminum layer 12, an LED element 21 disposed on a die pad 25 of the lead frame 15, and a bonding wire (electric conductor) 22 that electrically interconnects the LED element 21 and a lead portion 26 of the lead frame 15.

In addition, a reflecting resin section 23 is provided around the LED element 21. Furthermore, the LED element 21 and the bonding wire 22 are both sealed with a light-transmissive sealing resin 24.

Referring to FIGS. 13 and 14, in addition to upper surfaces of LED element resting regions 14 on the lead frame body 11, the vapor-deposited aluminum layer or sputtered aluminum layer 12 is further provided on inner walls 23*b* of the reflecting resin section 23. The vapor-deposited aluminum layer or sputtered aluminum layer 12 is shown in hatched form in FIG. 14.

Besides, the semiconductor device 20A shown in FIGS. 13 and 14 has substantially the same configuration as that of the semiconductor device 20 shown in FIGS. 5 and 6, and detailed description of the semiconductor device configuration is omitted herein.

Method of Manufacturing the Resin-Attached Lead Frame

Next, a method of manufacturing the resin-attached lead frame 10A shown in FIGS. 11 and 12 is described below using FIGS. 15(a) to (f) and 16(a) to (d). The following description focuses mainly upon differences with respect to the steps shown in FIGS. 7(a) to (g) and 8(a) to (c).

First as shown in FIG. 15(a) to (e), a lead frame body 11 having a die pad 25 and a lead portion 26 disposed away from the die pad 25 is fabricated in steps similar to those shown in FIG. 7(a) to (e).

Next, a lower surface of the lead frame body 11 is provided with electrolytic plating to form a silver-plated layer 29 on each of a first outer lead portion 27 and a second outer lead portion 28. Thus, as shown in FIG. 15(f), a lead frame 15 is obtained. At this time, the lead frame body 11 may alternatively have its entire surface plated with silver.

Next, a reflecting resin section 23 is formed on the surface of the lead frame body 11 to integrate the lead frame 15 and the reflecting resin section 23, as shown in FIG. 16(a) to (c). The step of forming the reflecting resin section 23, shown in FIG. 16(a) to (c), is substantially the same as the step of FIG. 8(a) to (c), except that the reflecting resin section 23 is formed before the vapor-deposited aluminum layer or sputtered aluminum layer 12 is formed.

Next as shown in FIG. 16(d), the LED element resting region 14 of the lead frame body 11 and the inner walls 23b of the reflecting resin section 23 are provided with aluminum vapor deposition or aluminum sputtering to form a vapor-deposited aluminum layer or sputtered aluminum layer 12. In this way, the resin-attached lead frame 10A shown in FIGS. 11 and 12 is obtained.

A method in which the semiconductor device 20A shown in FIGS. 13 and 14 is fabricated using the thus-obtained resin-attached lead frame 10A is substantially the same as the method shown in FIG. 9(a) to (f), and detailed description of the fabrication method is omitted herein.

As set forth above, the present embodiment enhances the extraction efficiency of the light from the LED element 21 and prevents the lead frame 15 from degrading with time.

In accordance with the present embodiment, the vapor-deposited aluminum layer or sputtered aluminum layer 12 is also provided on the inner walls 23b of the reflecting resin section 23. The aluminum constituting the vapor-deposited aluminum layer or sputtered aluminum layer 12 does not degrade even when exposed to the ultraviolet radiation emitted from the LED element 21, such that the reflecting resin section 23 can be prevented from degrading even when exposed to the ultraviolet radiation.

The invention claimed is:

1. A resin-attached lead frame, comprising:
a lead frame main body including:
an LED element resting portion;
a lead portion disposed apart from the LED element resting portion; and
an LED element resting region formed over an area including an upper surface of the LED element resting portion and an upper surface of the lead portion; and
a reflecting resin section surrounding the LED element resting region of the lead frame main body;
wherein
a vapor-deposited aluminum layer or a sputtered aluminum layer is provided on an upper surface of the LED element resting region of the lead frame main body; and
a non-through groove for enhancing adhesion between the lead frame main body and the reflecting resin section is formed along an outer edge of the LED element resting region on an upper surface of the lead frame main body.

2. A resin-attached lead frame, comprising:
a lead frame main body including:
an LED element resting portion;
a lead portion disposed apart from the LED element resting portion; and
an LED element resting region formed over an area including an upper surface of the LED element resting portion and an upper surface of the lead portion; and
a reflecting resin section surrounding the LED element resting region of the lead frame main body;
wherein
a vapor-deposited aluminum layer or a sputtered aluminum layer is provided on an upper surface of the LED element resting region of the lead frame main body; and
the vapor-deposited aluminum layer or the sputtered aluminum layer is formed on the lead frame main body via a bonding layer formed of a layer plated with silver.

3. The resin-attached lead frame according to claim 2, wherein the vapor-deposited aluminum layer or the sputtered aluminum layer is not provided on a section of an upper surface of the lead frame main body that is to be subjected to wire bonding.

4. The resin-attached lead frame according to claim 2, wherein the LED element resting portion comprises a mounting section that is to be subjected to the mounting of an LED element and a peripheral section around the mounting section, and the vapor-deposited aluminum layer or the sputtered aluminum layer is not provided on the mounting section of an upper surface of the lead frame main body.

5. A resin-attached lead frame, comprising:
a lead frame main body including:
an LED element resting portion;
a lead portion disposed apart from the LED element resting portion; and
an LED element resting region formed over an area including an upper surface of the LED element resting portion and an upper surface of the lead portion; and
a reflecting resin section surrounding the LED element resting region of the lead frame main body;
wherein
a vapor-deposited aluminum layer or a sputtered aluminum layer is provided on an upper surface of the LED element resting region of the lead frame main body, and is further provided on an inner wall of the reflecting resin section and at least a part of an upper surface of the reflecting resin section; and
the vapor-deposited aluminum layer or the sputtered aluminum layer is continuously formed from the upper surface of the LED element resting region to an upper end of the inner wall of the reflecting resin section via a lower end of the inner wall of the reflecting resin section.

6. A semiconductor device, comprising:
a lead frame main body including;
an LED element resting portion;

a lead portion disposed apart from the LED element resting portion; and an LED element resting region formed over an area including an upper surface of the LED element resting portion and an upper surface of the lead portion;

a reflecting resin section surrounding the LED element resting region of the lead frame main body;

an LED element resting on the LED element resting portion of the lead frame main body;

an electric conductor electrically interconnecting the LED element and the lead portion of the lead frame main body; and a sealing resin sealing the LED element and the electric conductor;

wherein a vapor-deposited aluminum layer or a sputtered aluminum layer is provided on an upper surface of the LED element resting region of the lead frame main body; and a non-through groove for enhancing adhesion between the lead frame main body and the reflecting resin section is formed along an outer edge of the LED element resting region on an upper surface of the lead frame main body.

7. A semiconductor device, comprising:

a lead frame main body including:

an LED element resting portion;

a lead portion disposed apart from the LED element resting portion; and an LED element resting region formed over an area including an upper surface of the LED element resting portion and an upper surface of the lead portion;

a reflecting resin section surrounding the LED element resting region of the lead frame main body;

an LED element resting on the LED element resting portion of the lead frame main body;

an electric conductor electrically interconnecting the LED element and the lead portion of the lead frame main body; and a sealing resin sealing the LED element and the electric conductor;

wherein a vapor-deposited aluminum layer or a sputtered aluminum layer is provided on an upper surface of the LED element resting region of the lead frame main body; and the vapor-deposited aluminum layer or the sputtered aluminum layer is formed on the lead frame main body via a bonding layer formed of a layer plated with silver.

8. A semiconductor device, comprising:

a lead frame main body including:

an LED element resting portion;

a lead portion disposed apart from the LED element resting portion; and an LED element resting region formed over an area including an upper surface of the LED element resting portion and an upper surface of the lead portion;

a reflecting resin section surrounding the LED element resting region of the lead frame main body;

an LED element resting on the LED element resting portion of the lead frame main body;

an electric conductor electrically interconnecting the LED element and the lead portion of the lead frame main body; and a sealing resin sealing the LED element and the electric conductor;

wherein a vapor-deposited aluminum layer or a sputtered aluminum layer is provided on an upper surface of the LED element resting region of the lead frame main body, and is further provided on an inner wall of the reflecting resin section and at least a part of an upper surface of the reflecting resin section; and the vapor-deposited aluminum layer or the sputtered aluminum layer is continuously formed from the upper surface of the LED element resting region to an upper end of the inner wall of the reflecting resin section via a lower end of the inner wall of the reflecting resin section.

\* \* \* \* \*